US008242780B2

(12) United States Patent
Geppert et al.

(10) Patent No.: US 8,242,780 B2
(45) Date of Patent: Aug. 14, 2012

(54) MAGNETIC RESONANCE METHOD AND DEVICE TO DIFFERENTIATE AMONG PIXELS REPRESENTING A SILICON-DOMINATED SUBSTANCE, WATER-DOMINATED TISSUE AND FAT-DOMINATED TISSUE

(75) Inventors: Christian Geppert, Erlangen (DE); Vladimir Jellus, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 321 days.

(21) Appl. No.: 12/732,538

(22) Filed: Mar. 26, 2010

(65) Prior Publication Data

US 2010/0244830 A1 Sep. 30, 2010

(30) Foreign Application Priority Data

Mar. 26, 2009 (DE) .................... 10 2009 015 006

(51) Int. Cl.
*G01V 3/00* (2006.01)
(52) U.S. Cl. ...................... 324/309; 324/318
(58) Field of Classification Search .......... 324/300–322; 600/307–445
See application file for complete search history.

(56) References Cited

U.S. PATENT DOCUMENTS

| 5,225,781 | A |   | 7/1993  | Glover et al.   |         |
|-----------|---|---|---------|-----------------|---------|
| 5,321,359 | A |   | 6/1994  | Schneider       |         |
| 6,400,151 | B1| * | 6/2002  | Haase et al.    | 324/309 |
| 7,084,626 | B2| * | 8/2006  | Ma et al.       | 324/307 |
| 7,684,846 | B2| * | 3/2010  | Johnson et al.  | 600/407 |
| 7,725,169 | B2| * | 5/2010  | Boppart et al.  | 600/473 |
| 2005/0030025 | A1 |   | 2/2005  | Ma et al.       |         |
| 2007/0282200 | A1 | * | 12/2007 | Johnson et al.  | 600/437 |
| 2009/0201021 | A1 |   | 8/2009  | Jellus          |         |

OTHER PUBLICATIONS

"Silicone-Specific Imaging Using an Inversion-recovery-Prepared Fast Three-Point Dixon Technique," Ma et al, Journal of Magnetic Resonance Imaging, vol. 19 (2004) pp. 298-302. "Selective MR Imaging of Silicone with the Three-point Dixon-technique," Schneider et al., Radiology, vol. 187, No. I, (1993) pp. 89-93.
"Breath-Hold Water and Fat Imaging Using a Dual-Echo Two-Point Dixon Technique With an Efficient and Robust Phase-Correction Algorithm," Ma, Magnetic Resonance in Medicine, Vo. 52, (2004) pp. 415-419.

* cited by examiner

*Primary Examiner* — Brij Shrivastav
(74) *Attorney, Agent, or Firm* — Schiff Hardin LLP

(57) ABSTRACT

In a magnetic resonance method and device for automatic differentiation of respective pixels as representing either a silicon-dominated substance, or fat-dominated tissue, or water-dominated tissue, a first magnetic resonance signal and a second magnetic resonance signal are acquired per pixel, wherein the first magnetic resonance signal per pixel is acquired at a point in time at which the phase of a magnetic resonance signal originating from water-containing tissue exhibits a phase opposite to the phase of a magnetic resonance signal originating from fat-containing tissue, and the second magnetic resonance signal is acquired per pixel at a point in time at which the phase of the magnetic resonance signal originating from water-containing tissue exhibits a phase identical to the phase of the magnetic resonance signal originating from fat-containing tissue, and the phase of a magnetic resonance signal originating from a silicon-containing substance exhibits a phase opposite to the phase of the magnetic resonance signal originating from water-containing or fat-containing tissue. A first intermediate result is determined that indicates whether the pixel represents water-dominated tissue or fat-dominated tissue on the basis of first magnetic resonance signals. A second intermediate result is determined that indicates whether the pixel represents the silicon-dominated substance on the basis of second magnetic resonance signals. The pixel is designated as representing water-dominated tissue, fat-dominated tissue or the silicon-dominated substance on the basis of the first intermediate result and the second intermediate result.

13 Claims, 4 Drawing Sheets

MAGNETIC RESONANCE METHOD AND DEVICE TO DIFFERENTIATE AMONG PIXELS REPRESENTING A SILICON-DOMINATED SUBSTANCE, WATER-DOMINATED TISSUE AND FAT-DOMINATED TISSUE

BACKGROUND OF THE INVENTION

1. Field of the Invention

The invention concerns a method and a device to automatically differentiate among silicon-dominated, water-dominated and fat-dominated tissue.

2. Description of the Prior Art

Imaging by means of nuclear magnetic resonance (i.e. magnetic resonance tomography, or MR tomography) is finding an ever-broader field of application in medical diagnostics. The magnitude of the MR signal and the phase (i.e. the direction of the magnetization vector that corresponds to the signal) exist for every image point in an MR image.

There are many applications of magnetic resonance tomography in which it is desired to differentiate tissue types.

In the case of tissue types that have respectively different chemical shifts, a different magnetic field results at the nucleus which leads to different resonance frequencies. In signal acquisition this leads to different phase angles of the two components. The most prominent representative of two different tissue types in the magnetic resonance signal are fat and water, but other applications are also possible. The resonance frequencies of fat and water are differentiated from each other by approximately 3.3 ppm (parts per million). Separation of the signals of two different tissue types (for example fat and water) can be done by utilization of the phase information of acquired MR signals.

In conventional methods to differentiate water-dominated tissue and fat-dominated tissue it is typical to acquire two (or more) magnetic resonance signals per pixel. In such methods (for example, those known as two-point Dixon techniques or the like) a magnetic resonance signal in which the phase of the magnetic resonance signal of water-containing tissue exhibits a phase equal to the phase of a magnetic resonance signal of fat-containing tissue, and a magnetic resonance signal in which the phase of the magnetic resonance signal of a water-containing tissue exhibits a phase opposite to the phase of a magnetic resonance signal of fat-containing tissue, are acquired per pixel. With the use of the two magnetic resonance signals acquired per pixel, it is then possible to differentiate water-dominated and fat-dominated tissue.

Two-point Dixon techniques for separation of fat and water portions are used in many diagnostic questions, for instance abdominal and breast MR imaging.

Furthermore, it can be desired to be able to differentiate among three types of tissue, for example silicon-dominated material, water-dominated tissue and fat-dominated tissue. Ideally a quantification of the different tissue types should also be possible.

For example if, in addition to clinical and oncological questions, MR imaging is also used for routine evaluation of implants (for example to check an integrity of cosmetic implants) or for progress monitoring in reconstructive plastic surgery, a fast, high-resolution imaging technique that can specifically depict the individual components (water, fat, silicon) is desirable due to the widespread use of silicon implants.

SUMMARY OF THE INVENTION

The invention also encompasses a non-transitory computer-readable storage medium encoded with programming instructions that cause a computerized control and processing system, of a magnetic resonance system, in which said storage medium is loaded, to implement the method described above and all embodiments thereof.

It is an object of the present invention to provide a method, a magnetic resonance system, a computer-readable storage medium that allow an automatic differentiation among silicon-dominated material, water-dominated tissue and fat-dominated tissue in a simple manner.

A method according to the invention for the automatic differentiation by magnetic resonance of respective pixels (acquired in a first MR image and a second MR image) as belonging to either silicon-dominated material, fat-dominated tissue or water-dominated tissue includes the following steps.

First magnetic resonance signal and a second magnetic resonance signal are acquired per pixel wherein the first magnetic resonance signal per pixel is acquired at a point in time at which the phase of a magnetic resonance signal of water-containing tissue exhibits a phase opposite to the phase of a magnetic resonance signal of fat-containing tissue, and the second magnetic resonance signal is acquired per pixel at a point in time at which the phase of a magnetic resonance signal of water-containing tissue exhibits a phase identical to the phase of a magnetic resonance signal of fat-containing tissue, and the phase of a magnetic resonance signal of silicon-containing material exhibits a phase opposite to the phase of a magnetic resonance signal of water-containing or fat-containing tissue. A first intermediate result is determined as to whether the pixel belongs to a water-dominated tissue or a fat-dominated tissue on the basis of first magnetic resonance signals, and a second intermediate result is determined as to whether the pixel belongs to a silicon-dominated tissue on the basis of second magnetic resonance signals. The pixel is then associated with water-dominated tissue, fat-dominated tissue or silicon-dominated tissue on the basis of the first and second intermediate result.

With the method it is thus possible after acquisition of only two magnetic resonance signals per pixel to associate each pixel with one of three different substance (tissue/material) tissue types occurring in the imaged examination volume.

In particular, the describe method thus allows up to three different MR images in which a substance type is respectively shown separately to be created from two MR images (acquired by means of a magnetic resonance system) in which substances of three different types (water-dominated, fat-dominated or silicon-dominated) have been acquired.

The second intermediate result for each acquired pixel can advantageously be determined for the generation of a silicon image, and the silicon image can be generated by associating, the value of the second magnetic resonance signal of the pixel with each pixel of the silicon image if the pixel according to the second intermediate result belongs to the silicon-dominated substance, or a value of zero is associated if the pixel according to the second intermediate result does not belong to the silicon-dominated substance.

For the generation of an intermediate water image, the first intermediate result for each acquired pixel can be analogously determined and the intermediate water image can be generated by associating the value of the first magnetic resonance signal of the pixel with each pixel of the intermediate water image if the pixel according to the first intermediate result belongs to the water-dominated tissue, or a value of zero is associated if the pixel according to the first intermediate result does not belong to the water-dominated tissue.

For the generation of an intermediate fat image, the first intermediate result for each acquired pixel can again be analogously determined and the intermediate fat image can be generated by associating the value of the first magnetic resonance signal of the pixel with each pixel of the intermediate fat image if the pixel according to the first intermediate result belongs to the fat-dominated tissue, or value of zero is associated if the pixel according to the first intermediate result does not belong to the fat-dominated tissue.

In this way, respective MR images that show tissue in which one of the three substance types is dominant can be created from only one magnetic resonance signal per pixel. In the case of the silicon image, the image that is obtained is a "pure" silicon image, meaning that exclusively silicon-containing regions are shown. This is due to the fact, in an examination region of a patient, that silicon is contained only in artificially introduced tissues (for example in implants, in particular in breast implants). In the case of the intermediate water image and intermediate fat image, although only water-dominated tissue or possibly silicon-dominated substance, or fat-dominated tissue or possibly silicon-dominated substance are shown, the magnetic resonance signals can be an overlay (superimposition) of the magnetic resonance signals of the three different substance types.

In another embodiment, an intermediate water image and/or an intermediate fat image can also be generated utilizing the first and second magnetic resonance signals. The first intermediate result for each acquired pixel is determined, and an intermediate water image is generated as follows. The sum of the values of the first and second magnetic resonance signal is associated with each pixel of the intermediate water image if the pixel belongs to the water-dominated tissue according to the first intermediate result, or the difference of the absolute value of the first magnetic resonance signal from the second magnetic resonance signal is associated with each pixel of the intermediate water image if the pixel belongs to the fat-dominated tissue according to the first intermediate result, or an intermediate fat image is generated by the sum of the absolute values of the first and second magnetic resonance signal being associated with each pixel of the intermediate fat image if the pixel belongs to the fat-dominated tissue according to the first intermediate result, or the difference of the absolute value of the first magnetic resonance signal from the second magnetic resonance signal being associated with each pixel of the intermediate fat image if the pixel belongs to the water-dominated tissue according to the first intermediate result.

In this way intermediate water and intermediate fat images are obtained that respectively contain only magnetic resonance signals of water and possibly of silicon, or of fat and possibly of silicon.

In a further embodiment, a water image or a fat image can be created on the basis of a described silicon image and an intermediate water image, or on the basis of a described silicon image and an intermediate fat image.

The first and second intermediate results are thus determined for each pixel, and from these results a silicon image and an intermediate water image and/or an intermediate fat image are created. A water image can now be created by processing the intermediate water image with the silicon image. A fat image can be created by processing the intermediate fat image with the silicon image.

The generation of the water image or the fat image occurs in a simple manner by a value of zero being associated with each pixel of the intermediate water image, or the intermediate fat image, if the pixel belongs to a silicon-dominated material on the basis of the second intermediate results, or the pixel retains the value of the intermediate water image or the intermediate fat image if the pixel does not belong to the silicon-dominated material on the basis of the second intermediate results. In this manner, portions of silicon remaining in the intermediate water image, or intermediate fat image, are eliminated.

A magnetic resonance system according to the invention for the automatic association of respective pixels, acquired by the magnetic resonance system in a first MR image and a second MR image, as belonging to either silicon-dominated material, fat-dominated tissue or water-dominated tissue, includes an operating (control) unit that operates a magnetic resonance data acquisition unit, a receiver device to receive signals acquired by the data acquisition unit, and an evaluation device to evaluate the signals and generate MR images. The magnetic resonance system is designed such that a first magnetic resonance signal and a second magnetic resonance signal are acquired per pixel, with the first magnetic resonance signal being acquired per pixel at a point in time at which the phase of magnetic resonance signal of water-containing tissue exhibits a phase opposite to the phase of a magnetic resonance signal of fat-containing tissue, and the second magnetic resonance signal is acquired per pixel at a point in time at which the phase of a magnetic resonance signal of water-containing tissue exhibits a phase identical to the phase of a magnetic resonance signal of fat-containing tissue, and the phase of a magnetic resonance signal of silicon-containing substance exhibits a phase opposite to the phase of magnetic resonance signal of water-containing or fat-containing tissue. The evaluation unit is configured to determine, as a first intermediate result, whether the pixel belongs to a water-dominated tissue or a fat-dominated tissue, based on first magnetic resonance signals, and to determine, as a second intermediate result, whether the pixel belongs to a silicon-dominated tissue, based on second magnetic resonance signals, and to associate the pixel with a water-dominated substance, a fat-dominated tissue or a silicon-dominated substance on the basis of the first and second intermediate results.

The magnetic resonance system is designed to implement the method described above and all embodiments thereof.

The present invention also encompasses a non-transitory computer-readable storage medium encoded with programming instructions. When the storage medium is loaded into a computerized control and processing system of a magnetic resonance apparatus, the programming instructions cause the computerized control and processing system to implement the method described above, and all embodiments thereof.

The advantages and embodiments described with regard to the method analogously apply to the magnetic resonance system and the computer-readable storage medium.

DESCRIPTION OF THE PREFERRED EMBODIMENTS

Figure 1:
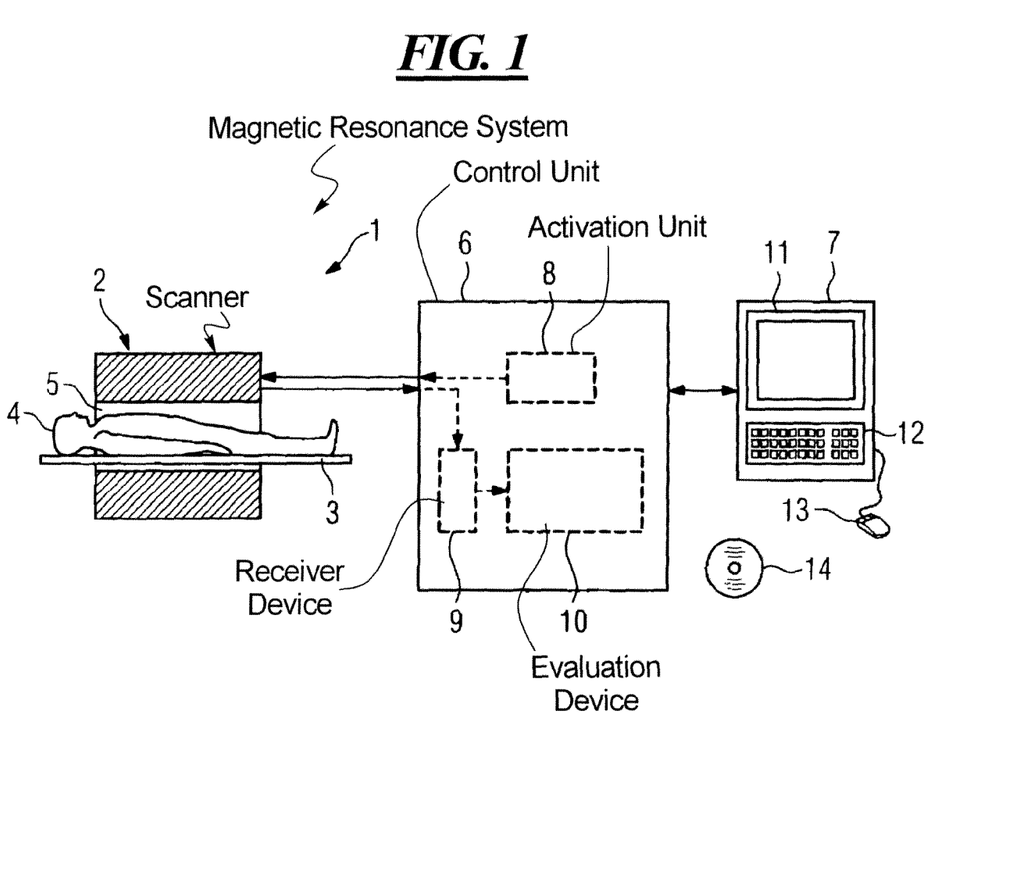
FIG. 1 schematically illustrates a magnetic resonance system according to an embodiment of the present invention.

FIG. 1 shows a magnetic resonance system 1 that includes a data acquisition unit (scanner) 2, a support device 3 for a patient 4 (the support device 3 being located in an opening 5 of the scanner 2), a control unit 6 and a processing unit 7. The control unit 6 includes an activation (operating) unit 8 to control the scanner 2, a receiver device 9 to receive signals which have been received by the scanner 2, and an evaluation device 10 to evaluate the signals acquired by the scanner 2 and to generate a magnetic resonance image (MR image). The processing unit 7 is, for example, a computer system with a monitor 11, a keyboard 12, a pointer input device (for example a mouse) 13 and a data storage medium 14 on which electronically readable control information are stored designed to implement the method described in the following upon loading of the data storage medium 14 in the processing unit 7.

In the scanner 2, multiple coils (not shown) generate a temporally constant magnetic field for polarization of the atomic nuclei in the patient 4 to be examined. These coils surround a cylindrical hollow space 5 into which the patient 4 to be examined is introduced for a magnetic resonance measurement. An additional gradient coil (not shown) is inserted into this hollow space and has, for example, three sub-windings that generate gradient fields that are respectively perpendicular to one another, proportional to the currents respectively supplied to the sub-windings. The sub-windings of the gradient coil are activated by the activation unit 8. Located within the gradient coil is a radio-frequency coil (not shown) that converts the RF pulses emitted by a power transmitter of the activation unit 8 into an alternating magnetic field to excite the atomic nuclei, and to subsequently convert the alternating field emanating from the precessing nuclear spins into a voltage that is further processed by the receiver device 9 and the evaluation device 10 to generate image information.

Figure 2:
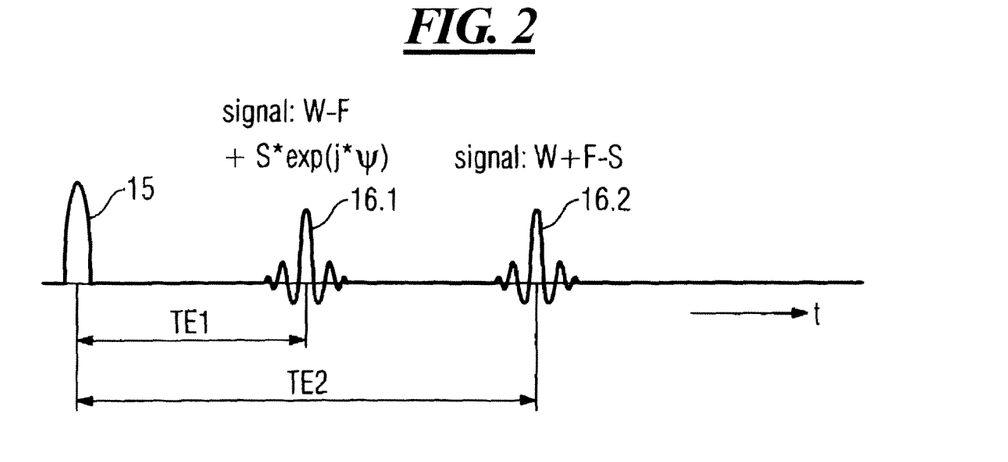
FIG. 2 schematically illustrates a spin echo pulse sequence to acquire first and second magnetic resonance signals according to an embodiment of the present invention.

FIG. 2 shows a portion of a spin echo pulse series to acquire first and second magnetic resonance signals for the method to automatically differentiate whether a pixel of an MR image acquired with the magnetic resonance system 1 belongs to fat-dominated tissue, water-dominated tissue or a silicon-dominated substance.

After emitting an RF pulse 15, an echo signal 16.1 is detected after a predetermined first echo time TE1. The first echo time TE1 is selected such that one (for example spin echo-based) magnetic resonance signal is detected per pixel of the MR image from the echo signal 16.1, in which the phase of a magnetic resonance signal originating from water-containing tissue exhibits a phase opposite the phase of a magnetic resonance signal originating from fat-containing tissue, and a magnetic resonance signal originating from a silicon-containing substance exhibits an arbitrary phase $\psi$. The phase $\psi$ of the magnetic resonance signal of the silicon-containing substance is arbitrary because the value thereof plays no role in the method described in the following.

After the emission of the RF pulse 15 an echo signal 16.2 is likewise acquired after a predetermined second echo time TE2. The second echo time TE2 is chosen such that one (for example spin echo-based) magnetic resonance signal is acquired per pixel of the MR image, in which the phase of a magnetic resonance signal of water-containing tissue exhibits the same phase as the phase of a magnetic resonance signal of fat-containing tissue and a magnetic resonance signal of a silicon-containing substance exhibits a phase opposite the phase of the magnetic resonance signal of fat-containing or water-containing tissue. This is possible because the chemical shift of silicon relative to water (approximately 1.7 ppm ("parts per million")) is approximately half as large as the chemical shift of fat relative to water (approximately 3.3 ppm). The chemical shifts of the different tissue types are thus sufficiently differentiated for a preparation of the echo signals 16.1, 16.2 described above.

The chronological order of the acquisition of the echo signals 16.1 and 16.2 is not limited to the signal shown in FIG. 2 (acquisition of the echo signal 16.2 after acquisition of the echo signal 16.1) since it is known that an echo signal 16.1 can also be acquired after a natural multiple of the shown echo time TE1. The order of the acquisition of the echo signals 16.1 and 16.2 can thus also be inverted.

Figure 3:
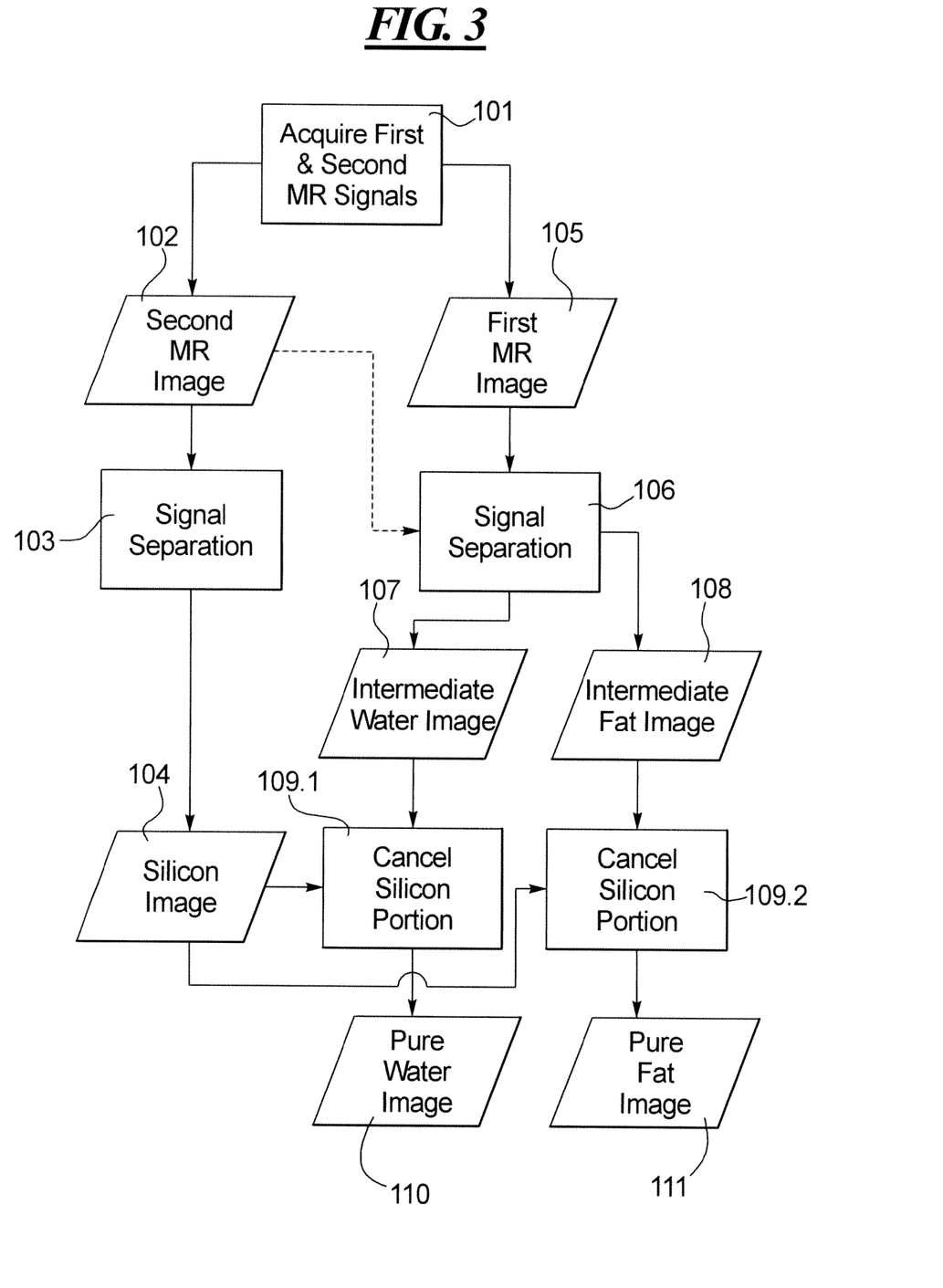
FIG. 3 is a flowchart of an embodiment of a method to create a water image, a fat image and a silicon image according to the present invention.
Figure 4:
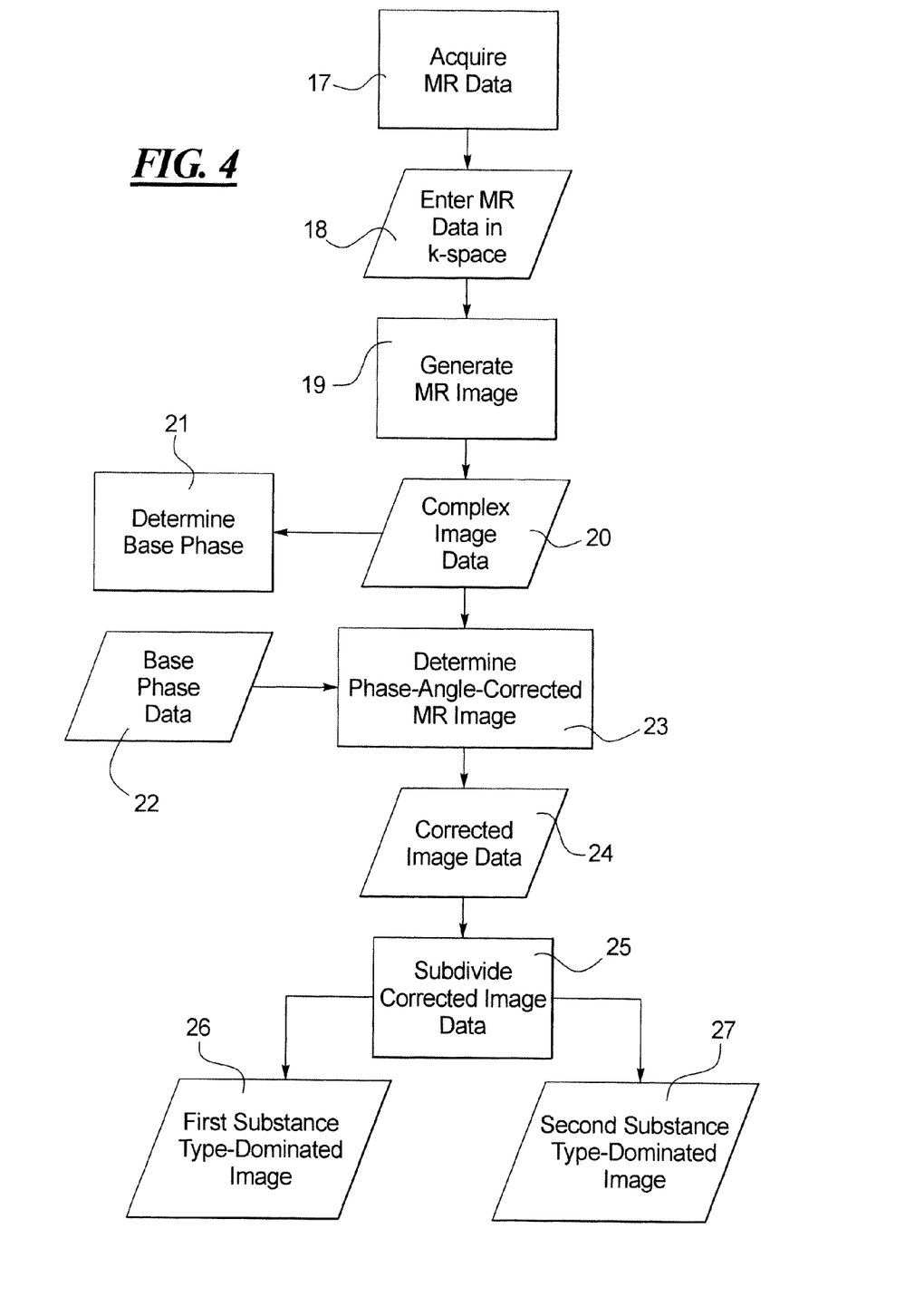
FIG. 4 is a flowchart of an embodiment of a method to separate pixels that are dominated by tissue of a first type and pixels that are dominated by tissue of a second type, for use in the present invention.
Figure 5:
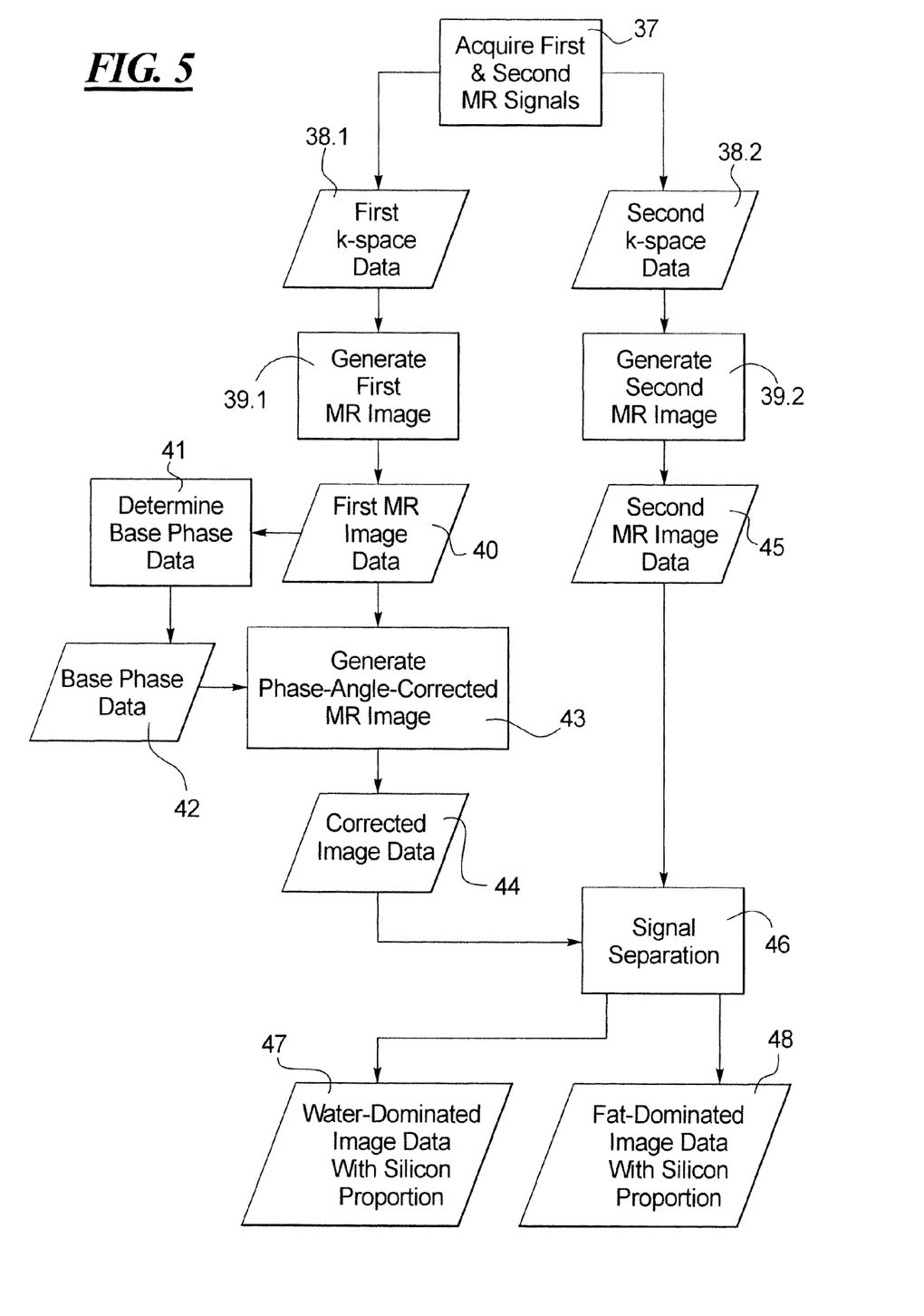
FIG. 5 is a flowchart of an embodiment of a method to separate pixels that are dominated by tissue of a first type and pixels that are dominated by tissue of a second type, for use in the present invention.

In the workflow diagrams shown in FIGS. 3 through 5, processes (for example an acquisition process or a calculation process) are represented by rectangular blocks and data (which have been determined in a process or which are used by a process for a determination) are represented by parallelogram-shaped blocks.

FIG. 3 shows a flowchart of a method to create a water image, a fat image and a silicon image according to an embodiment of the present invention.

In a first Step 101a first magnetic resonance signal and a second magnetic resonance signal are acquired as previously described for every pixel. The acquisition or measurement in Step 101, depending on whether a two-dimensional (2D) or three-dimensional (3D) measurement is implemented, results in a first complex 2D or 3D signal and a second complex 2D or 3D signal being entered in k-space. From this k-space data, the evaluation device 10 of FIG. 1 generates a first MR image (corresponding to the first magnetic resonance signals) and a second MR image (corresponding to the second magnetic resonance signals). Shown in Block 102 is a complex second MR image ("W+F−S") created in such a manner and shown in Block 105 is a complex first MR image ("W−F+S*exp(j$\psi$)") created in such a manner.

The second MR image 102 is subjected in Step 103 to a signal separation of the signals with opposite phase (here "W+F" and "S"). This means that, for each pixel of the second MR image 102, it is determined as a second intermediate result whether the pixel belongs to a silicon-dominated substance or water- and/or fat-dominated tissue. The second MR image is decomposed into a silicon image 104 and a water/fat image (not shown) with this information. The water/fat image is not important to the further method and is therefore discarded. A method suitable for Step 103 is described in detail later with regard to FIG. 4.

The creation of the silicon image 104 on the basis of the second intermediate results, the absolute value of the second magnetic resonance signal of the pixel is respectively associated with every pixel of the silicon image 104 if the pixel belongs to the silicon-dominated tissue, or a value of zero is associated if the pixel does not belong to the silicon-dominated tissue.

In Step 106 the first MR image 105 is likewise subjected to a signal separation of the signals with opposite phase (here "W" and "F"). This means that, for each pixel of the first MR image 105, it is determined as a first intermediate result whether the pixel belongs to a water-dominated or fat-dominated tissue. The first MR image is decomposed into an intermediate water image 107 and an intermediate fat image 108 with this information. For example, a method described later with regard to FIG. 4 is likewise suitable for Step 106. A "two-point Dixon" technique, as is explained below with reference to FIG. 5, for example, or another known decomposition technique that also incorporates the second MR image 102 in the decomposition (dashed arrow), is advantageously used in Step 106, and thus the first intermediate result per pixel is respectively determined on the basis of the first magnetic resonance signal and the second magnetic resonance signal. A quantification of a water portion and a fat portion in tissue that contains both water and fat is possible in this way.

In Step 106, magnetic resonance signals of silicon-dominated tissue ("S*exp(jψ)") contained in the first MR image 105 are added to either the intermediate water image 107 or the intermediate fat image 108, depending on the phase ψ.

In order to obtain a pure water image 110 and a pure fat image 111, in Steps 109.1 and 109.2 each pixel is therefore associated with water-dominated tissue, fat-dominated tissue, or a silicon-dominated substance on the basis of the first intermediate result and the second intermediate result.

This occurs in a simple manner in that a silicon portion of the intermediate water image 107 is canceled in Step 109.1 in that a value of zero is respectively associated with each pixel of the water image 110 if (on the basis of the second intermediate results) the pixel belongs to the silicon-dominated substance, or the value of the intermediate water image 107 for the pixel is retained if (on the basis of the second intermediate results) the pixel does not belong to the silicon-dominated substance; and in Step 109.2 a silicon component (contribution) of the intermediate fat image 108 is canceled by a value of zero being respectively associated with each pixel of the fat image 111 if (on the basis of the second intermediate results) the pixel belongs to the silicon-dominated substance, or the value of the intermediate fat image for the pixel is retained if (on the basis of the second intermediate results) the pixel does not belong to the silicon-dominated substance.

An association of a pixel with a silicon-dominated substance thus ensues if, in Step 103, it was determined that the pixel belongs to a silicon-dominated substance; an association of a pixel with a water-dominated tissue ensues if it was determined in Step 103 that the pixel does not belong to a silicon-dominated substance and in Step 106 it was determined that the pixel belongs to a water-dominated substance; and an association of a pixel with a fat-dominated tissue if it was determined in Step 103 that the pixel does not belong to a silicon-dominated substance and in Step 106 it was determined that the pixel belongs to a fat-dominated tissue.

This is easily possible since a substance determined as silicon-dominated contains no water portions or fat signal contributions.

The described method above thus allows three images that separately show every tissue type to be created from two MR images 102, 105 acquired by means of a magnetic resonance system in which tissue and substances of three different types have been acquired.

FIG. 4 is a flowchart of a method that can be applied in Steps 103 and/or 106 in the method described with reference to FIG. 3. The flowchart is based on the acquisition of a magnetic resonance signal in which magnetic resonance signal contributions of a substance of a first type and a substance of a second type are present. The signal component (contribution) originating from the substance of the first type has a phase opposite a phase of a magnetic resonance signal contribution originating from the substance of the second type (for example a magnetic resonance signal 16.1 with water-containing tissue as the substance of the first type and fat-containing tissue as the substance of the second type, or a magnetic resonance signal 16.2 with water- and/or fat-containing tissue as the substance of the first type and a silicon-containing substance as the substance of the second type) for each pixel of an MR image. A decomposition of the MR image into an image in which the substance of the first type is dominant and an image in the substance of the second type is dominant is implemented.

In a first Step 17, an MR image is acquired as described above with the aid of one spin echo-based magnetic resonance signal per magnetic resonance signal. Depending on whether a 2D or 3D measurement is implemented, the acquisition or measurement in Step 17 yields a complex 2D or 3D signal in k-space, as is shown in Block 18.

In the evaluation device 10 of FIG. 1, in Step 19 an MR image is created. The result of the MR image creation of Step 19 is a complex 2D or 3D image as is shown in Block 20. Each pixel B(x,y,z) of the complex 2D or 3D MR image comprises a real part and an imaginary part. Each pixel B(x,y,z) at a point in space x, y, z is composed of a contribution from the substance of the first type Ga(x,y,z) and a contribution from the substance of the second type Gb(x,y,z) at the point in space of the pixel. Since the acquisition point in time of the MR image is chosen such that the phase of the magnetic resonance signal of the substance of the first type exhibits a phase opposite a phase of the magnetic resonance signal of the substance of the second type, in the ideal case the pixel B would be equal to the difference of content of the substance of the first type and content of the substance of the second type, i.e. B=(Ga−Gb). In this ideal case it can be decided on the basis of the algebraic sign of B whether the pixel contains more signal of the substance of the first type than signal of the substance of the second type (indicating a site in the subject in which the substance of the first type is dominant) or more signal of the substance of the second type than signal of the substance of the first type (indicating a site in the subject in which the substance of the second type is dominant). Due to system inadequacies—magnetic field inhomogeneities, a static phase due to a radio-frequency penetration or a signal delay in the receiver device 12, for example—the signal for the pixel is phase-shifted by y. Thus, for the pixel B:

$$B=(Ga-Gb)e^{j\psi} \qquad (1)$$

In order to remove the influence these deficiencies, this base phase ψ is to be determined at the pixel B.

The phase angle φ of the pixel can be determined from the complex value of the pixel B as follows:

$$B = |B| \cdot e^{j\varphi} \Rightarrow e^{j\varphi} = \frac{B}{|B|} \qquad (2)$$

The absolute value of B thereby corresponds to the absolute value of the difference of the signal contribution of the substance of the first type Ga and the signal contribution of the substance of the second type Gb in the pixel. However, the algebraic sign of this difference is initially unknown, so that:

$$(Ga - Gb) = \pm |Ga - Gb| = \begin{cases} |Ga - Gb| \cdot e^{j0} & \text{for } Ga > Gb \\ |Ga - Gb| \cdot e^{j\pi} & \text{for } Ga < Gb \end{cases} \qquad (3)$$

Thus, for the pixel B:

$$B = |Ga - Gb| \cdot e^{j\Delta} \cdot e^{j\varphi}{}_{mit} \begin{array}{l} \Delta = 0 \text{ for } Ga > Gb \\ \Delta = \pi \text{ for } Ga < Gb \end{array} \quad (4)$$

so that ultimately the base phase ψ at the pixel B is:

$$\psi = \Delta + \varphi{}_{mit} \begin{array}{l} \Delta = 0 \text{ for } Ga > Gb \\ \Delta = \pi \text{ for } Ga < Gb \end{array} \quad (5)$$

For an arbitrary first pixel the base phase at this first pixel is then determined arbitrarily in step 21 at either φ or φ+π according to Equation (5). For all additional pixels of the MR image the base phases at the additional pixels are determined starting from the first pixel and the base phase and the first pixel. Use is made of the fact that the base phase changes only slightly between adjacent pixels. Assuming the first pixel and the fact that the base phase changes only slightly between adjacent pixels, base phases at additional pixels are then determined as described in the following.

In the environment of a pixel X for which the base phase is to be determined, at least one pixel Y is located for which the base phase has already been determined. A phase difference between the phase angle of the pixel X and the base phase of pixel Y is initially determined. If this phase difference is smaller than 90° (or, respectively, smaller than π/2), the base phase ψx of the pixel X is most probably equal to the phase angle φx of the pixel X, and the base phase of the pixel X is defined as ψx:=φx. By contrast, if the phase difference is greater than 90° (or, respectively, greater than n/2), the base phase ψx of the pixel X is most probably opposite to the phase angle φx of the pixel X, and the base phase of the pixel X is defined as ψx:=φx+π.

If the corresponding base phases have already been determined for multiple pixels, in the further course of the method the base phase of a pixel X can be determined in that the phase difference is calculated from the difference between the phase angle of the pixel X to be determined and the phase angle of a vector sum of multiple pixels Y in proximity to the pixel X to be determined for which corresponding base phases have already been determined. The multiple pixels Y in proximity to the pixel X to be determined can, for example, be multiple pixels from a spatial environment of 5×5×5 or 7×7×7 pixels around the pixel X to be determined. The phase angle of the vector sum results via vector addition of the pixels Y, wherein the base phase determined before for the respective pixel Y is used as a phase angle of these pixels Y. The base phase of the pixel X that is to be determined is determined on the basis of this phase difference. If the phase difference is smaller than 90° the value of the phase angle φx of the pixel X is associated with the base phase ψx, and if the phase difference is greater than 90° the value of the phase angle φx of the pixel X plus 180° is associated with the base phase ψX. After the base phase has been determined for the pixel X as described in the preceding, the pixel can then be used to determine the base phases of additional pixels, for example as part of a corresponding vector sum.

In this way a base phase can be determined with the aid of the region growing method described in the preceding, starting from a randomly estimated base phase value for each pixel. The base phase (Block 22) determined in this way is used together with the complex image data of Block 20 in Step 23 to generate an MR image with corrected phase angles (Block 24). The complex image data of the MR image of Block 24 exhibit for each pixel a phase of either 0° or 180° (or, respectively, π). Using this phase angle, a subdivision of the MR image 24 into an image 26 of a site in which the substance of the first type dominates, and an image 27 of a site in which the substance of the a second type dominates, is possible (Step 25). However, at this point it is still not clear whether the pixels with a phase angle of 0° belong to the site in which tissue of a first type dominates and the pixels with a phase angle of 180° belong to the site in which tissue of a second type dominates, or vice versa.

Therefore a first MR image is initially created from the original MR image 24 by the value of the corresponding pixel of the original MR image 24 being associated with (assigned to) each pixel of the first MR image if the phase angle of this pixel in the original MR image amounts to 0°, and otherwise a value of 0 is associated with the pixel of the first MR image. A second MR image is likewise created from the original MR image 24 by either the value of the corresponding pixel of the original MR 24 being associated with each pixel of the second MR image if the phase angle of the pixel of the original MR image is 180° (or π), or otherwise a value of 0 is associated.

A first average value of all pixels of the first MR image that are different than 0 and a second average value of all pixels of the second MR image that are different than 0 are then generated. Since the values of pixels representing a site in which the substance of the second type dominates are in general greater than the values of pixels representing a site in which the substance of the first type dominates, by comparison of the two average values it can be determined which of the two MR images represents the image 27 of the site in which the substance of the second type dominates, and which represents the image 26 of the site in which the substance of the first type dominates (Block 26 and 27).

Alternatively, it is possible to determine which of the two MR images represents the image of the site in which the substance of the second type dominates and which represents the image of the site in which the substance of the first type dominates by using anatomical knowledge is used in order to identify one or more pixels as being pixels that represent the substance of the first or the second type. By checking whether the pixels predetermined in this way are among the first or second pixels that are different than 0, an association of the first MR image and second MR image with the site in which the substance of the first or second type dominates can be implemented.

With a method described in regard to FIG. 4 it is not possible to quantify the respective proportions of the substance of the first type and the substance of the second type in an image in which both substances are present. It is only possible to establish a dominant substance. However, this is often sufficient, in particular if there is no mixing of the substances of the first type and the second type, for example as in an examination of a patient with a silicon implant (for example a breast implant) where silicon exists only in the silicon implant. In such a method described with regard to FIG. 4, a single magnetic resonance signal per pixel is sufficient to be able to implement a separation of the two different substance types.

FIG. 5 shows a flowchart of a procedure to separate pixels that are dominated by substances of two different types, that it can be applied in an embodiment of the present invention in Step 106 from FIG. 3. The flowchart of FIG. 5 shows the basis of a "two-point Dixon" technique. It is an advantage of such a method that a quantification of the proportions of the separate tissue types is also possible per pixel.

In a first Step 37 first and second magnetic resonance signals are detected for every pixel (as described in FIG. 2, for example). Depending on whether a two-dimensional (2D) or three-dimensional (3D) measurement is implemented, the acquisition or measurement in Step 37 yields a first and a second complex 2D or 3D signal in k-space, as shown in Blocks 38.1 and 38.2. The phase of a magnetic resonance signal of water-containing tissue is opposite to the phase of fat-containing tissue in magnetic resonance signals of the first complex 2D or 3D signal 38.1, and the phase of a magnetic resonance signal of a silicon-containing substance amounts to an arbitrary value ψ. By contrast, in magnetic resonance signals of the second complex 2D or 3D signal 38.2 the phase of magnetic resonance signal of water-containing tissue is parallel to the phase of fat-containing tissue, and the phase of a magnetic resonance signal of a silicon-containing substance is opposite the phase of magnetic resonance signal of fat-containing or water-containing tissue.

In the evaluation device 10 of FIG. 1, in Steps 39.1 and 39.2 a first MR image ("W−F+S*exp(jψ)") 40 is created from the first complex 2D or 3D signal 38.1 and a second MR signal ("W+F−S") 45 is created from the second complex 2D or 3D signal. The first MR image and the second MR image are respective complex 2D or 3D images 39.1, 39.2.

For an arbitrary first pixel in the first MR image 40 the base phase at this first pixel is then arbitrarily defined either as φ or as φ+π in Step 41, for example according to Equation (5) shown with regard to FIG. 4, or according to another method known in connection with "two-point Dixon" techniques with phase correction, for example according to Jingfei Ma:"Breath-Hold Water and Fat Imaging Using a Dual-Echo Two-Point Dixon Technique With an Efficient and Robust Phase-Correction Algorithm", Magnetic Resonance in Medicine 52:415-419 (2004). For all further pixels of the first MR image 40 the base phases at the additional pixels are determined starting from the first pixel and the base phase at the first pixel, for example by means of a "region growing" method under the assumptions typical in "two-point Dixon" techniques.

The base phase (Block 42) determined in this way is used together with the complex image data of the first MR image 40 in Step 43 to create an MR image 44 with corrected phase angles. The complex image data of the MR image 44 exhibit a phase of either 0° or 180° (or π) for every pixel.

After the correction of the phase angle in the first MR image 40 in Step 43, the pixels with signal contributions originating from fat can now be separated from the pixels with signal contributions originating from water in Step 46, with signal contributions originating from silicon being proportionately contained in the separated water signal contributions and fat signal contributions depending on the phase ψ in the first MR image 40. An MR image ("W+a*S") 47 with water-dominated tissue and a proportion a of a silicon-dominated substance and an MR image ("F+b*S") 48 with fat-dominated tissue and a proportion b of a silicon-dominated substance are obtained.

The separation into an MR image ("W+a*S") 47 and an MR image ("F+b*S") 48 occurs by, for example, the sum of the values of the first magnetic resonance signal and the second magnetic resonance signal from the first and the second complex 2D or 3D signals 38.1 and 38.2 being respectively associated with each pixel of the first MR image ("W+a*S") 47 if the pixel belongs to the water-dominated tissue (corresponding to the determined base phase), or the difference between the absolute values of the first magnetic resonance signal and the second magnetic resonance signal being respectively associated with each pixel of the first MR image ("W+a*S") 47 if the pixel belongs to the fat-dominated tissue (corresponding to the determined base phase). This case differentiation thus accounts for phase shifts between first and second magnetic resonance signals.

The sum of the values of the first magnetic resonance signal and the second magnetic resonance signal from the first and the second complex 2D or 3D signals 38.1 and 38.2 is correspondingly respectively associated with each pixel of the MR image ("F+b*S") 48 if the pixel belongs to the fat-dominated tissue (corresponding to the determined base phase), or the difference between the absolute values of the first magnetic resonance signal and the second magnetic resonance signal is respectively associated with each pixel of the MR image ("F+b*S") 48 if the pixel belongs to the water-dominated tissue (corresponding to the determined base phase).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to automatically differentiate respective pixels in magnetic resonance images as representing either a silicon-dominated substance, or fat-dominated tissue, or water-dominated tissue, comprising the steps of with a magnetic resonance data acquisition unit, acquiring magnetic resonance data from a subject in the data acquisition unit that will be processed to form pixels in at least one magnetic resonance image, by acquiring, for each pixel, a first magnetic resonance signal from the subject and a second magnetic resonance signal from the subject;

operating said data acquisition unit to acquire said first magnetic resonance signal for each pixel at a point in time at which a phase of a magnetic resonance signal originating from water-containing tissue in the subject exhibits a phase opposite to a phase of a magnetic resonance signal originating from fat-containing tissue in the subject, and acquiring said second magnetic resonance signal, for each pixel, at a point in time at which the phase of said magnetic resonance signal originating from water-containing tissue in the subject exhibits a phase identical to the phase of the magnetic resonance signal originating from fat-containing tissue in the subject, and a phase of a magnetic resonance signal originating from a silicon-containing substance in the subject exhibits a phase opposite to the phase of the magnetic resonance signal originating from water-containing tissue or the phase of the magnetic resonance signal originating from fat-containing tissue;

for each pixel, automatically determining, in a processor, a first intermediate result indicating whether that pixel represents a signal originating from water-dominated tissue or fat-dominated tissue, based on said first magnetic resonance signal;

for each pixel, automatically determining in said processor, a second intermediate result indicating whether that pixel represents a signal originating from said silicon-dominated substance, based on said second magnetic resonance signal; and in said processor, automatically designating each pixel as representing either water-dominated tissue or fat-dominated tissue, or said silicon-dominated substance, based on said first intermediate result and said second intermediate result, and making said pixels available at an output of said processor, embodying the respective designations, in an image or in a form allowing generation of said at least one magnetic resonance image from said pixels.

2. A method as claimed in claim 1, comprising:
for each pixel, designating, in said processor, that pixel as representing said silicon-dominated substance when said second intermediate result indicates that pixel represents a signal originating from said silicon-dominated substance; and
for each pixel, designating, in said processor, that pixel as representing water-dominated tissue when said second intermediate result indicates that pixel did not originate from said silicon-dominated substance; and
for each pixel, designating, in said processor, that pixel as representing fat-dominated tissue when said second intermediate result indicates that pixel did not originate from said silicon-dominated substance and said first intermediate result indicates that pixel originated from fat-dominated tissue.

3. A method as claimed in claim 1 comprising, in said processor, determining said first intermediate result with a correction of the phase angle of that pixel in the first magnetic resonance signal.

4. A method as claimed in claim 1 comprising, in said processor, determining said second intermediate result with a correction of the phase angle of the pixel in the second magnetic resonance signal.

5. A method as claimed in claim 1 comprising, in said processor, determining said first intermediate result based on said second magnetic resonance signal for that pixel, in addition to said first magnetic resonance signal for that pixel.

6. A method as claimed in claim 1 comprising, in said processor, generating an intermediate water image of the subject from said pixels embodying the respective designations, by assigning each pixel in said intermediate water image a value equal to a value of the first magnetic resonance signal when that pixel originated from water-dominated tissue, and assigning a value of zero to that pixel in the intermediate water image when that pixel did not originate from water-dominated tissue.

7. A method as claimed in claim 1 comprising, in said processor, generating an intermediate water image from said pixels embodying the respective designations, by assigning that pixel a value in said intermediate water image equal to a sum of respective absolute values of said first magnetic resonance signal and said second magnetic resonance signal for that pixel when that pixel originated from water-dominated tissue, and assigning that pixel a value in said water-dominated image equal to difference of the respective absolute values of said first magnetic resonance signal and said second magnetic resonance signal when that pixel originated from fat-dominated tissue.

8. A method as claimed in claim 1 comprising, in said processor, generating an intermediate fat image of the subject from said pixels embodying the respective designations, by assigning each pixel in said intermediate fat image a value equal to a value of the first magnetic resonance signal when that pixel originated from fat-dominated tissue, and assigning a value of zero to that pixel in the intermediate fat image when that pixel did not originate from fat-dominated tissue.

9. A method as claimed in claim 1 comprising, in said processor, generating an intermediate fat image from said pixels embodying the respective designations, by assigning that pixel a value in said intermediate fat image equal to a sum of respective absolute values of said first magnetic resonance signal and said second magnetic resonance signal for that pixel when that pixel originated from fat-dominated tissue, and assigning that pixel a value in said fat-dominated image equal to difference of the respective absolute values of said first magnetic resonance signal and said second magnetic resonance signal when that pixel originated from fat-dominated tissue.

10. A method as claimed in claim 1 comprising, in said processor, generating a silicon image from said pixels with said respective designations embodied therein by, for each pixel, giving that pixel a value in said silicon image equal to an absolute value of the second magnetic resonance signal of that pixel when that pixel is designated as originating from said silicon-dominated substance, and assigning that pixel a value of zero when said pixel is not designated as originating from said silicon-dominated tissue.

11. A method as claimed in claim 1 comprising:
in said processor, generating an intermediate fat image based on said first intermediate results and respective absolute values of said first and second magnetic resonance signals for each pixel;
in said processor, generating an intermediate water image based on said first intermediate results and said respective absolute values of said first and second magnetic resonance signals for each pixel;
in said processor, generating a silicon image based on said second intermediate results and said absolute values of said second magnetic resonance signals for each pixel;
in said processor, generate a water image by assigning a value of zero to each pixel in said water image when said pixel is not designated as originating from said silicon-dominated substance based on said second intermediate results, and assigning each pixel of the water image a value of that pixel in the intermediate water image when that pixel is not designated as originating from silicon-dominated tissue based on said second intermediate results; and
in said processor, generating a fat image by assigning a value of zero to each pixel in said fat image when that pixel is designated as originating from said silicon-dominated substance based on said second intermediate results, and assigning that pixel a value in said fat image equal to the value of the pixel in the intermediate fat image when that pixel is not designated as originating from said silicon-dominated substance based on said second intermediate results.

12. A magnetic resonance system to automatically differentiate respective pixels in magnetic resonance images as representing either a silicon-dominated substance, or fat-dominated tissue, or water-dominated tissue, comprising:
a magnetic resonance data acquisition unit;
a control unit configured to operate the magnetic resonance data acquisition unit to acquire magnetic resonance data from a subject in the data acquisition unit that will be processed to form pixels in at least one magnetic resonance image, by acquiring, for each pixel, a first magnetic resonance signal from the subject and a second magnetic resonance signal from the subject;
said control unit being configured to operate said data acquisition unit to acquire said first magnetic resonance signal for each pixel at a point in time at which a phase of a magnetic resonance signal originating from water-containing tissue in the subject exhibits a phase opposite to a phase of a magnetic resonance signal originating from fat-containing tissue in the subject, and acquiring said second magnetic resonance signal, for each pixel, at a point in time at which the phase of said magnetic resonance signal originating from water-containing tissue in the subject exhibits a phase identical to the phase of the magnetic resonance signal originating from fat-containing tissue in the subject, and a phase of a magnetic resonance signal originating from a silicon-containing substance in the subject exhibits a phase opposite to the phase of the magnetic resonance signal originating from water-containing tissue or the phase of the magnetic resonance signal originating from fat-containing tissue;

said control unit comprising a processor configured, for each pixel, to automatically determine a first intermediate result indicating whether that pixel represents a signal originating from water-dominated tissue or fat-dominated tissue, based on said first magnetic resonance signal;

said processor being configured, for each pixel, to automatically determine a second intermediate result indicating whether that pixel represents a signal originating from said silicon-dominated substance, based on said second magnetic resonance signal; and said processor being configured to automatically designate each pixel as representing either water-dominated tissue or fat-dominated tissue, or said silicon-dominated substance, based on said first intermediate result and said second intermediate result, and to make said pixels available at an output of said processor, embodying the respective designations, in an image or in a form allowing generation of said at least one magnetic resonance image from said pixels.

13. A non-transitory computer-readable storage medium encoded with programming instructions, said programming instructions, when said medium is loaded into a computerized control and processing system of a magnetic resonance system, also comprising a magnetic resonance data acquisition unit, causing said computerized control and processing system to:

operate a magnetic resonance data acquisition unit to acquire magnetic resonance data from a subject in the data acquisition unit that will be processed to form pixels in at least one magnetic resonance image, by acquiring, for each pixel, a first magnetic resonance signal from the subject and a second magnetic resonance signal from the subject;

operate said data acquisition unit to acquire said first magnetic resonance signal for each pixel at a point in time at which a phase of a magnetic resonance signal originating from water-containing tissue in the subject exhibits a phase opposite to a phase of a magnetic resonance signal originating from fat-containing tissue in the subject, and acquiring said second magnetic resonance signal, for each pixel, at a point in time at which the phase of said magnetic resonance signal originating from water-containing tissue in the subject exhibits a phase identical to the phase of the magnetic resonance signal originating from fat-containing tissue in the subject, and a phase of a magnetic resonance signal originating from a silicon-containing substance in the subject exhibits a phase opposite to the phase of the magnetic resonance signal originating from water-containing tissue or the phase of the magnetic resonance signal originating from fat-containing tissue;

for each pixel, automatically determine a first intermediate result indicating whether that pixel represents a signal originating from water-dominated tissue or fat-dominated tissue, based on said first magnetic resonance signal;

for each pixel, automatically determine a second intermediate result indicating whether that pixel represents a signal originating from said silicon-dominated substance, based on said second magnetic resonance signal; and automatically designate each pixel as representing either water-dominated tissue or fat-dominated tissue, or said silicon-dominated substance, based on said first intermediate result and said second intermediate result, and make said pixels embodying the respective designations available at an output of said computerized control and processing system in an image or in a form allowing generation of said at least one magnetic resonance image from said pixels.

\* \* \* \* \*